(12) United States Patent  
Jung et al.

(10) Patent No.: US 10,015,885 B2  
(45) Date of Patent: Jul. 3, 2018

(54) PRINTED CIRCUIT BOARD, AND METHOD FOR MANUFACTURING SAME

(71) Applicant: LG INNOTEK CO., LTD., Seoul (KR)

(72) Inventors: Won Suk Jung, Seoul (KR); Yun Ho An, Seoul (KR); Sang Myung Lee, Seoul (KR); Joon Wook Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 183 days.

(21) Appl. No.: 14/655,627

(22) PCT Filed: Dec. 20, 2013

(86) PCT No.: PCT/KR2013/011913  
§ 371 (c)(1),  
(2) Date: Jun. 25, 2015

(87) PCT Pub. No.: WO2014/104654  
PCT Pub. Date: Jul. 3, 2014

(65) Prior Publication Data  
US 2015/0334843 A1    Nov. 19, 2015

(30) Foreign Application Priority Data  
Dec. 26, 2012 (KR) .......................... 10-2012-0152907

(51) Int. Cl.  
*H05K 1/18* (2006.01)  
*H05K 1/11* (2006.01)  
(Continued)

(52) U.S. Cl.  
CPC ............. *H05K 1/185* (2013.01); *H05K 1/115* (2013.01); *H05K 1/183* (2013.01); *H05K 3/181* (2013.01);  
(Continued)

(58) Field of Classification Search  
None  
See application file for complete search history.

(56) References Cited

U.S. PATENT DOCUMENTS 7,972,936 B1     7/2011  Brewer et al.  
2008/0049405 A1* 2/2008  Sahara ................... H05K 1/183  
                                                              361/761

(Continued)

FOREIGN PATENT DOCUMENTS

JP  2005-340713 A  12/2005  
JP  2010-098286 A   4/2010  
(Continued)

OTHER PUBLICATIONS

International Search Report dated Apr. 22, 2014 issued in Application No. PCT/KR2013/011913.

*Primary Examiner* — Courtney Smith  
*Assistant Examiner* — Jessey R Ervin  
(74) *Attorney, Agent, or Firm* — KED & Associates, LLP

(57) ABSTRACT

Provided are a printed circuit board and a method of manufacturing the printed circuit board, the printed circuit board including: a first element and a second element; a first base substrate including an embedding part in which the first element is embedded and a cavity into which the second element is mounted; and a second base substrate bonded to one surface of the first base substrate and including a first via for the second element.

6 Claims, 5 Drawing Sheets

(51) Int. Cl.
    *H05K 3/46*        (2006.01)
    *H05K 3/30*        (2006.01)
    *H05K 3/18*        (2006.01)

(52) U.S. Cl.
    CPC ............ *H05K 3/30* (2013.01); *H05K 3/4611* (2013.01); *H05K 3/4688* (2013.01); *H01L 2224/04105* (2013.01); *H01L 2224/16227* (2013.01); *H01L 2224/32225* (2013.01); *H01L 2224/73267* (2013.01); *H01L 2224/8203* (2013.01); *H01L 2924/15153* (2013.01); *H05K 2201/09563* (2013.01); *H05K 2201/10121* (2013.01); *H05K 2201/10151* (2013.01); *Y10T 156/10* (2015.01)

(56) References Cited

U.S. PATENT DOCUMENTS

2011/0164391 A1* 7/2011 Shin .................. H01L 23/13
                                                361/761
2012/0024583 A1* 2/2012 Lee .................. H05K 1/186
                                                174/260

FOREIGN PATENT DOCUMENTS

KR      10-2011-0074138 A      6/2011
KR           10-1084250 B2    11/2011

* cited by examiner

PRINTED CIRCUIT BOARD, AND METHOD FOR MANUFACTURING SAME

CROSS-REFERENCE TO RELATED APPLICATION

This application is a U.S. National Stage Application under 35 U.S.C. § 371 of PCT Application No. PCT/KR2013/011913, filed Dec. 20, 2013, which claims priority to Korean Patent Application No. 10-2012-0152907, filed Dec. 26, 2012, whose entire disclosures are hereby incorporated by reference.

TECHNICAL FIELD

Embodiments of the present invention relate to a printed circuit board, and a method of manufacturing the printed circuit board.

BACKGROUND ART

A printed circuit board (PCB) is formed by printing a circuit pattern on an electric insulating substrate with a conductive material, and refers to a circuit board which is configured such that positions for mounting each component are determined, and circuit line for connecting the components is printed on and is fixed to the surface of a flat board, thereby enabling many kinds of electronic components to be densely mounted on the flat board.

Meanwhile, an embedded printed circuit board (PCB) is a printed circuit board in which passive components, such as a resistor, a capacitor, and an inductor, are embedded in a substrate. Technologies for mounting negative components, such as an integrated circuit (IC) chip, have been also developed. In terms of this fact, regardless of the kind of mounted components, the embedded printed circuit board (PCB) has been used as a term called a printed circuit board in which electronic components are embedded.

With regard to a technology for a printed circuit board, in order to embed electronic components, a method of mounting the components, a cavity processing method, a method of connecting the electrode of a chip and a PCB circuit, and the like are very important.

Also, as the number of components embedded in the printed circuit board has been increased, and each thickness of components has been increased, a thickness of the printed circuit board has been also increased. Thus, the development of a technology for reducing a thickness of the printed circuit board has been needed.

DISCLOSURE OF INVENTION

Technical Problem

Accordingly, the present invention has been made keeping in mind the above problems. An aspect of the present invention provides a printed circuit board and a method of manufacturing the printed circuit board, which can reduce a thickness of the printed circuit board.

Solution to Problem

In order to solve the problem, according to an aspect of the present invention, a printed circuit board according to one embodiment of the present invention includes: a first element and a second element; a first base substrate including an embedding part in which the first element is embedded and a cavity into which the second element is mounted; and a second base substrate bonded to one surface of the first base substrate and including a first via for the second element.

According to another embodiment, the printed circuit board may further include: a first circuit layer formed on the first base substrate; and a second circuit board formed on the second base substrate.

According to still another embodiment, the printed circuit board may further include an insulating layer formed between the first substrate and the second substrate.

According to still another embodiment, the first base substrate may include a second via connecting the first circuit layer and the first element.

According to still another embodiment, the printed circuit board may further include: a first solder resist layer formed on the first circuit layer; and a second solder resist layer formed on the second circuit layer.

According to still another embodiment, the second element may be an image sensor or a photo sensor.

According to still another embodiment, the first element may be a controller chip.

According to another aspect of the present invention, a method of manufacturing a printed circuit board according to one embodiment of the present invention may include: forming an embedding part and a cavity on a first base substrate on which a first metal layer is laminated; forming a first via and a second metal layer on a second base substrate; bonding the first base substrate and the second base substrate; embedding a first element in the embedding part; and embedding a second element in the cavity.

According to another embodiment, the bonding the first base substrate and the second base substrate may be performed by interposing an insulating layer between the first base substrate and the second base substrate.

According to still another embodiment, the method may further include patterning the first metal layer and the second metal layer to form a first circuit layer and a second circuit layer after the bonding the first base substrate and the second base substrate.

According to still another embodiment, the method may further include forming a second via connecting the first circuit layer and the first element after the bonding the first base substrate and the second base substrate.

According to still another embodiment, the method may further include forming a first solder resist layer on the first circuit layer and forming a second solder resist layer on the second circuit layer after the bonding the first base substrate and the second base substrate.

According to still another embodiment, the forming the embedding part and the cavity on the first base substrate on which the first metal layer is laminated may include: preparing a dummy core layer to process cavities in the dummy core layer; attaching a bonding film to one side of the dummy core layer; mounting the first element and a dummy element in the cavities, the dummy element having the same thickness as that of the second element having a larger thickness than that of the first element; laminating an insulating member on the first element to be flattened with respect to an upper surface of the dummy element; and forming the first metal layer on the dummy element and the insulating member.

According to still another embodiment, the forming the first via and the second metal layer on the second base substrate may include preparing a core member in which metal layers are laminated on both surfaces of the insulating member; and forming the first via for the second element in the core member.

According to still another embodiment, the forming the first via for the second element in the core member may include forming a via hole in the core member and filling the via hole with a conductive material.

According to still another embodiment, the forming the first via for the second element in the core member may include patterning the metal layer formed on one surface of the core member to form an electrode pad for the second element.

According to still another embodiment, the forming the first via for the second element in the core member may include forming a plating layer on the electrode pad using electroless plating.

Advantageous Effects of Invention

According to the present invention, an entire thickness of a printed circuit board for embedding or mounting elements, such as a controller chip, an image sensor and the like, can be reduced.

BEST MODE FOR CARRYING OUT THE INVENTION

Hereinafter, preferred embodiments of the present invention will be described in detail with reference to the accompanying drawings. In the following description, it is to be noted that, when the functions of conventional elements and the detailed description of elements related with the present invention may make the gist of the present invention unclear, a detailed description of those elements will be omitted. In the figures, the dimensions of elements may be exaggerated for clarity of illustration, and do not means practically applied dimensions.

Figure 1:
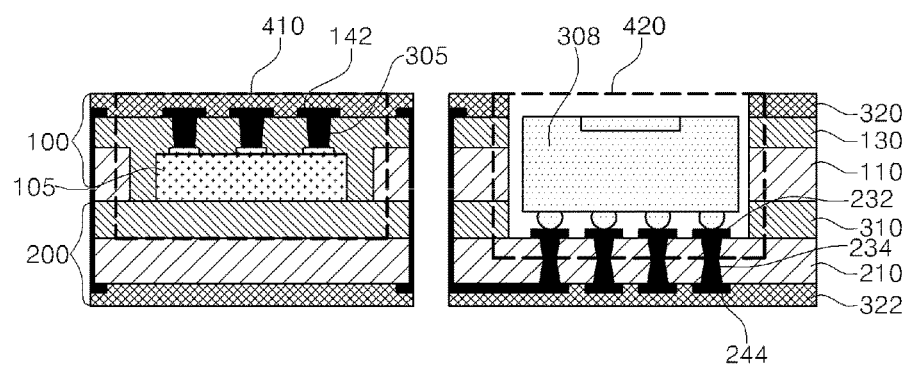
FIG. 1 is a cross-sectional view of a printed circuit board according to one embodiment of the present invention.

FIG. 1 is a cross-sectional view of a printed circuit board according to one embodiment of the present invention.

Referring to FIG. 1, a printed circuit board according to one embodiment of the present invention will be described with reference to FIG. 1.

The printed circuit board according to one embodiment of the present invention includes: an embedding part 410 in which a first element 105 is embedded; and a cavity 420 into which a second element 308 is mounted. A first circuit layer 142 to which the first element 105 is connected is formed on one surface of the printed circuit board, and a second circuit layer 244 to which the second element 308 is connected is formed on the other surface of the printed circuit board. Accordingly, a first via 234 for the second element 308 and a second via 305 for the first element 105 may be formed on both surfaces of the printed circuit board, respectively.

Specifically, the printed circuit board includes: a first base substrate 100 including the cavity adopted to embed the first element 105 and to mount the second element 308; a second base substrate 200 bonded to one surface of the first base substrate 100 and including the first via 234 for the second element 308; the first circuit layer 142 formed on the first base substrate 100; and the second circuit layer 244 formed on the second base substrate 200. The first base substrate 100 includes: the embedding part 410 in which the first element 105 is embedded; and the cavity 420 into which the second element 308 is mounted.

Also, the printed circuit board includes an adhesive insulating layer 310 formed between the first base substrate and the second base substrate. A prepreg (PPG) insulator may be used as a material of the adhesive insulating layer 310. As an intermediate substrate for a fiber reinforcing composite material, PPG is a molding material resulting from preliminarily impregnating a matrix resin with a reinforcing fiber. A thermosetting resin, such as a polymeric epoxy resin, and the like, may be used as the PPG, and a thermoplastic resin, such as polyetherkethone and the like, may be also used.

The second element 308 may be an image sensor or a photo sensor. The first element 105 may be a controller chip. In general, the image sensor or the photo sensor has a larger thickness than that of the controller chip. Since the second element 308 should receive a signal and information from the outside, a part of the image chip 308 should be exposed to the outside or should be open.

The first base substrate 100 includes: a dummy core layer 110; and an insulating layer 130. The dummy core layer 110 may be made of an insulating material. The first element 105 is embedded in the first base substrate 100, and the second element 308 is mounted to the open cavity.

The first circuit layer 142 is formed on the first base substrate 100, and the first base substrate 100 includes the second via 305 connecting the first circuit layer 142 and the first element 105. A first solder resist layer 320 is formed on the first circuit layer 142. The first circuit layer may be made of a material having high electrical conductivity and low resistance and may be formed by patterning a copper foil corresponding to a thin copper layer, namely, a first metal layer.

The second base substrate 200 includes: an insulating member 210; and the first via 234 for the second element on the insulating member. Circuit patterns are formed on both surfaces of the insulating member 210. The circuit patterns formed on one surface of the core layer 210 opposite to the second element 308 corresponds to an electrode pad layer 232 for the second element 308. A plated layer 240 for enabling easy connection with the first element 105 may be formed on the electrode pad layer 232.

The circuit patterns formed on the other surface of the insulating member 210 form the second circuit layer 244. The first via 234 is intended to connect the second element and the second circuit layer 244. A second solder resist layer 322 is formed on the second circuit layer 244.

As described above, the printed circuit board according to one embodiment of the present invention includes at least two elements, wherein the vias for the two elements are oriented toward two facing sides of the printed circuit board.

FIGS. 2 to 5 are cross-sectional views of processes illustrated for explaining a method of manufacturing a printed circuit board according to a preferred embodiment of the present invention. Hereinafter, a method of manufacturing the printed circuit board will be described with reference to FIGS. 2 to 5.

Figure 2:
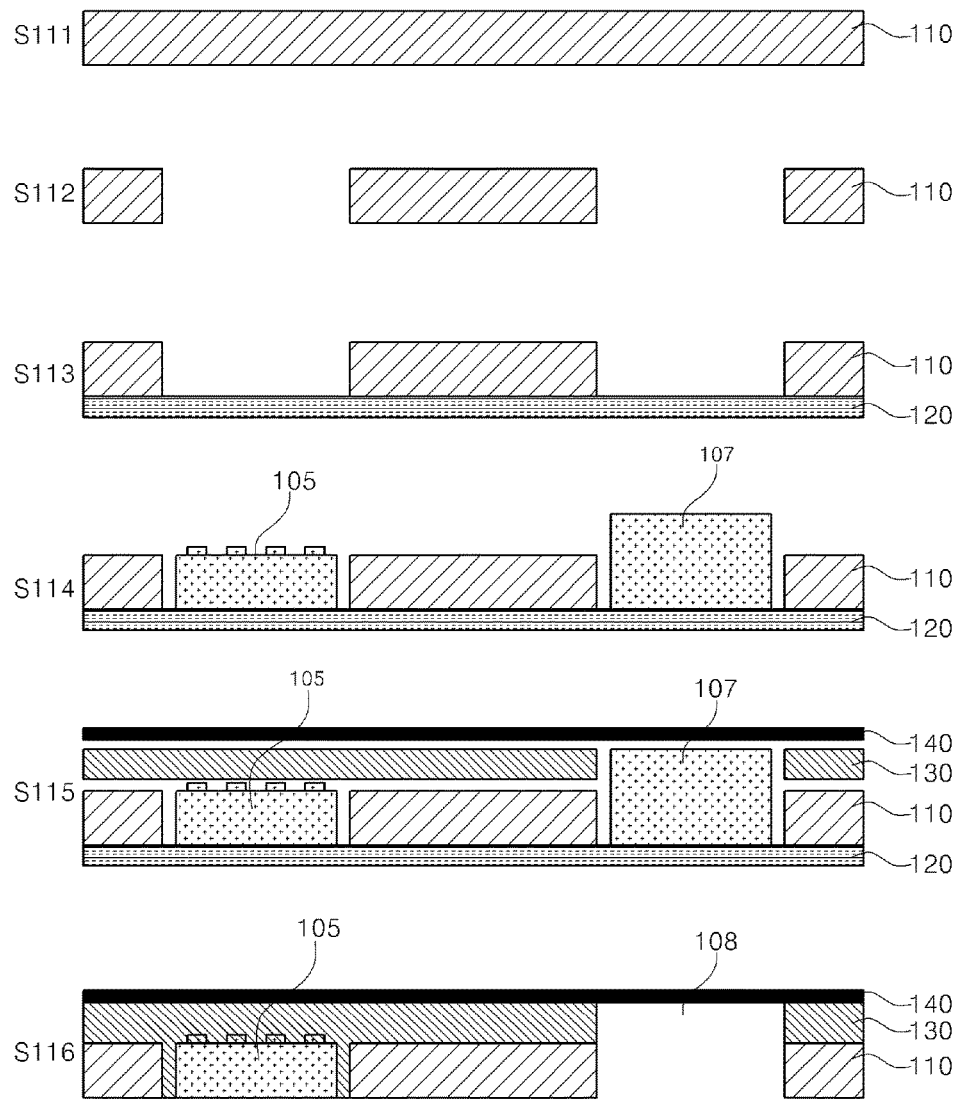
FIG. 2 is a cross-sectional view of processes illustrated for explaining a method of manufacturing a first base substrate according to one embodiment of the present invention.
Figure 3:
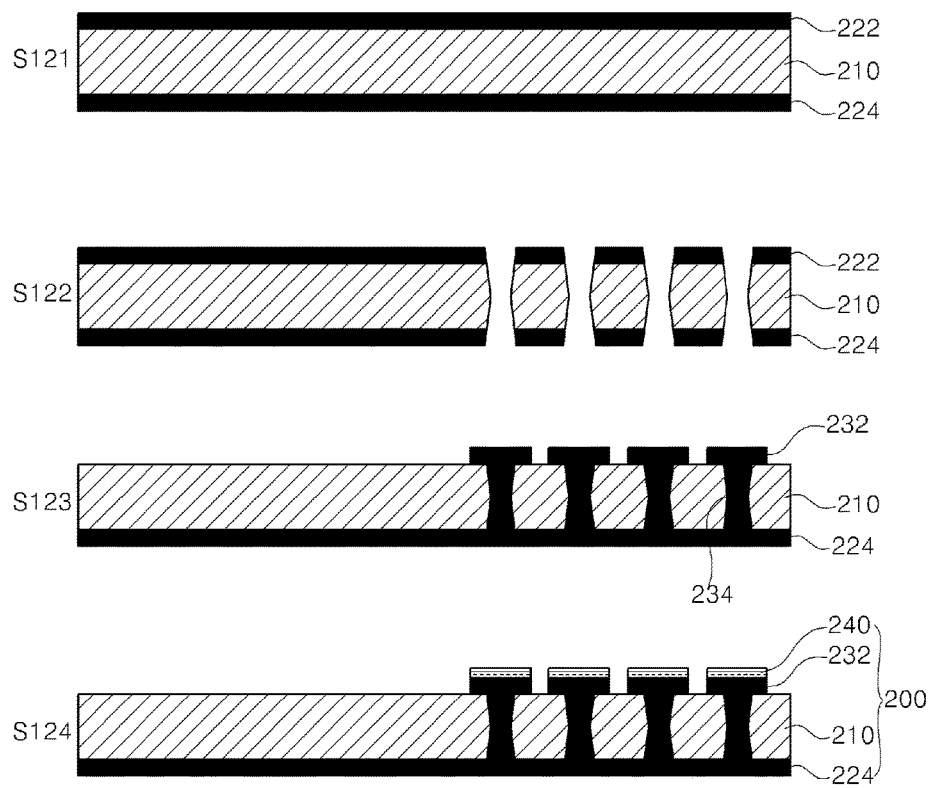
FIG. 3 is a cross-sectional view of processes illustrated for explaining a method of manufacturing a second base substrate according to one embodiment of the present invention.

FIG. 2 is a cross-sectional view of processes illustrated for explaining a method of manufacturing the first base substrate according to one embodiment of the present invention, and FIG. 3 is a cross-sectional view of processes illustrated for explaining a method of manufacturing the second base substrate according to one embodiment of the present invention.

First, referring to FIG. 2, the dummy core layer 110 is provided (S111), and cavities are processed in the dummy core layer 110 (S112). Then, a bonding film 120 is attached to one side of the dummy core layer 110 (S113), and the first element 105, and a dummy element 107 having the same thickness as that of the second element having a larger thickness than that of the first element are mounted into the cavities of the dummy core layer 110 (S114). Then, the insulating member 130 and the metal layer 140 are laminated on the first element to be flattened with respect to an upper surface of the dummy element 107 (S115), and are pressed by applying press thereto (S116). Finally, the bonding film 120 and the dummy element 107 are removed (S117).

The method of manufacturing the second base substrate 200 will be described with reference to FIG. 3.

Referring to FIG. 3, a core member in which metal layers 222, 224 are laminated on both surfaces of the insulating member 210 is prepared (S121), a via hole is formed in the core member (S122). The via hole is processed by a CNC drill method, or a $CO_2$ or YAG laser drill method.

Subsequently, the via hole is filled with a conductive material, and thereafter, the electrode pad 232 for the second element 308 is formed by patterning the metal layer formed on one surface of the insulating member 210 (S123). That is, the metal layer 222 formed on one surface of the core member to which the second element 308 is mounted is patterned. The metal layer 224 formed on the other surface of the core member becomes a second metal layer 224. Last, the plated layer 240 is formed on the electrode pad 232 using electroless gold plating.

According to the present embodiment, the first base substrate 100 and the second base substrate 200 may be manufactured by the aforesaid processes.

Figure 4:
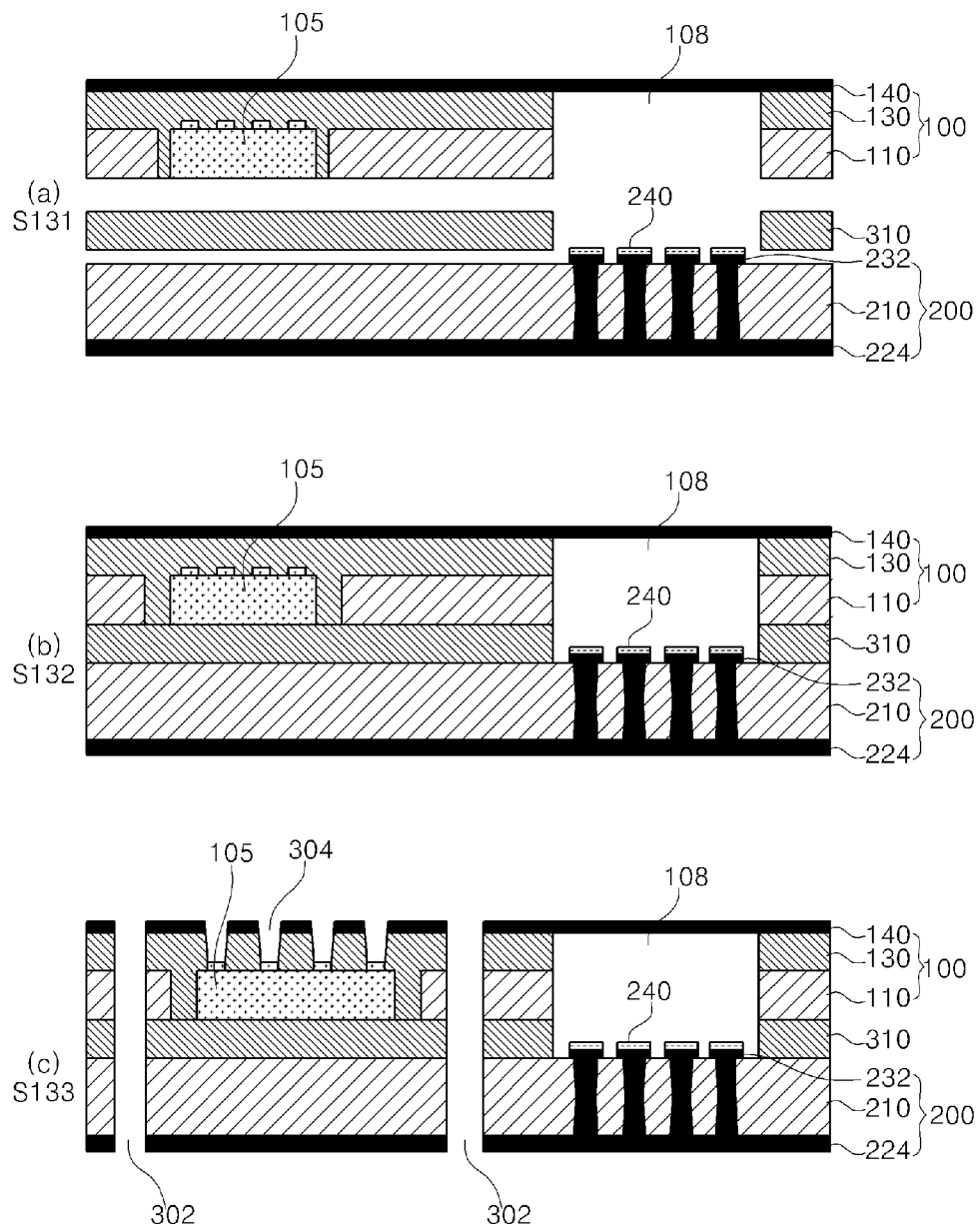
FIGS. 4 and 5 are cross-sectional views of processes illustrated for explaining a method of manufacturing a printed circuit board according to one embodiment of the present invention.
Figure 5:
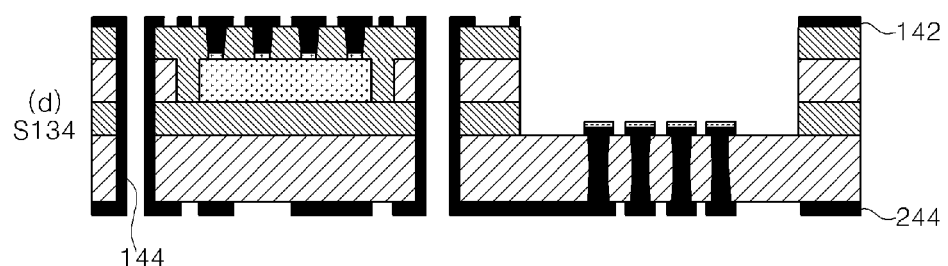
Figure 5:
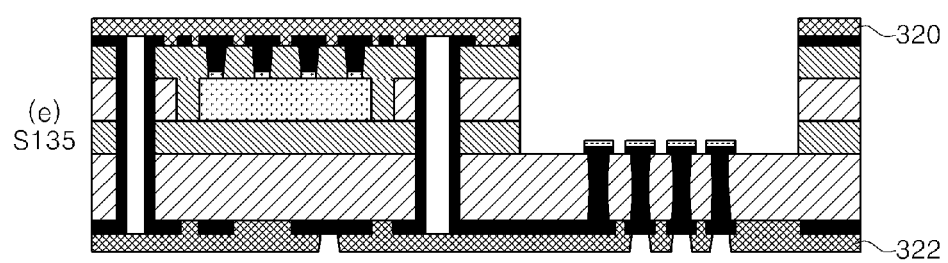
Figure 5:
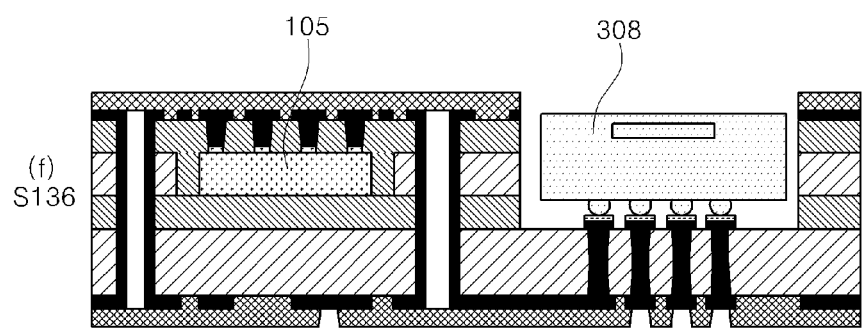

FIGS. 4 and 5 are cross-sectional views of processes illustrated for explaining a method of manufacturing the printed circuit board according to one embodiment of the present invention.

Referring to FIGS. 4 and 5, after the first base substrate 100 and the second base substrate 200 have been produced, the first base substrate 100 and the second base substrate 200 are bonded to each other (S131, S132). When the first base substrate 100 and the second base substrate 200 are bonded to each other, the insulating layer 310 is interposed between the first base substrate 100 and the second substrate 200. That is, the insulating layer 310 is positioned on the second base substrate 200, and the first base substrate 100 is disposed thereon, and thereafter lamination is performed by compression.

Then, the via 234 connecting the first circuit layer 140 and the first element 105 is formed. Specifically, a via hole for an electrical connection of the first element 105 embedded in the first base substrate 100 is formed (S133). At this time, a through hole 302 may be formed in the printed circuit board. Subsequently, the via hole is filled with a conductive material, and the first circuit layer and the second circuit layer 244 are formed by patterning the first metal layer 140 and the second metal layer 224 (S134). After this, the first solder resist layer 320 is formed on the first circuit layer 142, and the second solder resist layer 322 is formed on the second circuit layer 244. Last, the second element 308 is mounted into the cavity for the second element 308 to produce the printed circuit board.

As previously described, in the detailed description of the invention, having described the detailed embodiments of the invention, it should be apparent that modifications and variations can be made without deviating from the spirit or scope of the invention. That is, in the embodiments of the present invention, even though the embodiments of the printed circuit board composed of two or three elements have been described, the present invention is not limited to the configurations. In the case of a printed circuit board composed of three or more elements, an insulating layer may be additionally formed to correspond to the number of the elements. Thus, it is obvious that various modifications may be implemented.

The technical idea of the present invention should not be limited to the aforesaid embodiments of the present invention, and should be determined within the scope of the appended claims and their equivalents.

[Description of Reference Numerals]

| | |
|---|---|
| 100: First base substrate | 105: First element |
| 142: First circuit layer | 200: Second base substrate |
| 234: Second circuit layer | 244; Second via |
| 305: First via | 308: Second element |
| 310: Insulating layer | 410: Embedding part |
| 420: Cavity | |

What is claimed is:

1. A printed circuit board, comprising: a first element and a second element; a first base substrate including an embedding part in which the first element is embedded and a cavity into which the second element is mounted; a second base substrate bonded to one surface of the first base substrate and including a first via for the second element; an adhesive insulating layer formed between the first base substrate and the second base substrate, wherein the first base substrate includes: a dummy core layer on the adhesive insulating layer, and including the embedding part and a first part of the cavity, a first insulating layer on the dummy core layer to cover the embedding part and an upper part of the dummy core layer, and including a second part of the cavity, a first circuit layer on the first insulating layer; a second via for the first element, the second via for the first element passing through the first insulating layer to connect the first element and the first circuit layer, wherein the adhesive insulating layer includes a third part of the cavity, wherein the second base substrate includes: a second insulating layer below the adhesive insulating layer, a second circuit layer below the second insulating layer, and the first via for the second element, the first via for the second element passing through the second insulating layer to connect the second element and the second circuit layer, wherein a lower surface of the first element is exposed through a lower surface of the dummy core layer and is in direct physical contact with an upper surface of the adhesive insulating layer, wherein a lower surface of the second element is positioned at a lower level than the lower surface of the first element in the cavity, wherein an upper surface of the second element is positioned at a higher level than an upper surface of the first element in the cavity, wherein the first element is an image sensor or a photo sensor, and the second element is a controller chip, wherein the first element is embedded in the embedding part by the first insulating layer, wherein the second element is exposed to an outside by the cavity, wherein a terminal of the first element is disposed toward an upper surface of the first insulating layer, wherein a terminal of the second element is disposed toward an upper surface of the second insulating layer, wherein the first via is neither vertically nor horizontally overlapped with the second via, wherein the first via is vertically overlapped with the second element, wherein the second via is vertically overlapped with the first element, wherein a first solder resist layer is formed on the first insulating layer, wherein a second solder resist layer is formed below the second insulating layer, wherein the first solder resist layer does not include an opening to expose the second via, and wherein the second solder resist layer does not include an opening to expose the first via.

2. A method of manufacturing a printed circuit board, comprising: forming an embedding part and a cavity in a first base substrate on which a first metal layer is laminated; forming a first via and a second metal layer on a second base substrate; bonding the first base substrate and the second base substrate; patterning the first metal layer and the second metal layer to form a first circuit layer and a second circuit layer after the bonding the first base substrate and the second base substrate; forming a second via connecting the first circuit layer and a first element; embedding the first element in the embedding part; embedding a second element in the cavity, wherein the forming of the embedding part and the cavity in the first base substrate on which the first metal layer is laminated includes: preparing a dummy core layer to process the embedding part and the cavity in the dummy core layer; attaching a bonding film to one side of the dummy core layer; mounting the first element in the embedding part and a dummy element in the cavity, a thickness of the dummy element corresponding to a thickness of the second element and being larger than a thickness of the first element; laminating a first insulating member on the first element to be flattened with respect to an upper surface of the dummy element; and forming the first metal layer on the dummy element and the first insulating member, wherein the bonding of the first base substrate and the second base substrate includes interposing an adhesive insulating layer between the first base substrate and the second base substrate, wherein the cavity includes: a first part formed by passing through the dummy core layer, a second part formed by passing through the first insulating member, and a third part formed by passing through the adhesive insulating layer, wherein a lower surface of the first element is exposed through a lower surface of the dummy core layer and in direct physical contact with an upper surface of the adhesive insulating layer, wherein a lower surface of the second element is positioned at a lower level than the lower surface of the first element in the cavity, wherein an upper surface of the second element is positioned at a higher level than an upper surface of the first element in the cavity, wherein the first element is an image sensor or a photo sensor, and the second element is a controller chip, wherein the first element is embedded in the embedding part by the first insulating member, wherein the second element is exposed to an outside by the cavity, wherein a terminal of the first element is disposed toward an upper surface of the first insulating layer, wherein a terminal of the second element is disposed toward an upper surface of a second insulating member below the adhesive insulating layer, wherein the first via is neither vertically nor horizontally overlapped with the second via, wherein the first via is vertically overlapped with the second element, wherein the second via is vertically overlapped with the first element, wherein the method further includes forming a first solder resist layer on the first circuit layer and forming a second solder resist layer on the second circuit layer after the bonding of the first base substrate and the second base substrate, wherein the first solder resist layer does not include an opening to expose the second via, and wherein the second solder resist layer does not include an opening to expose the first via.

3. The method of claim 2, wherein the forming of the first via and the second metal layer on the second base substrate comprises:
   preparing a core member in which metal layers are laminated on both surfaces of a second insulating member; and
   forming the first via for the second element in the core member.

4. The method of claim 3, wherein the forming the first via for the second element in the core member includes:
   forming a via hole in the core member; and
   filling the via hole with a conductive material.

5. The method of claim 3, wherein the forming of the first via for the second element in the core member includes patterning the metal layer formed on one surface of the core member to form an electrode pad for the second element.

6. The method of claim 5, wherein the forming of the first via for the second element in the core members includes:
   forming a plating layer on the electrode pad using electroless plating.

* * * * *